United States Patent [19]

Malhi

[11] Patent Number: 5,539,238
[45] Date of Patent: Jul. 23, 1996

[54] AREA EFFICIENT HIGH VOLTAGE MOSFETS WITH VERTICAL RESURF DRIFT REGIONS

[75] Inventor: Satwinder Malhi, Garland, Tex.

[73] Assignee: Texas Instruments Incorporated, Dallas, Tex.

[21] Appl. No.: 939,349

[22] Filed: Sep. 2, 1992

[51] Int. Cl.$^6$ .......................... H01L 29/00; H01L 29/76; H01L 29/94; H01L 31/062
[52] U.S. Cl. ......................... 257/510; 257/374; 257/335
[58] Field of Search .................................. 257/510, 374, 257/335, 336, 327, 344, 402, 408

[56] References Cited

FOREIGN PATENT DOCUMENTS

| 61-141180 | 6/1986 | Japan | 257/344 |
|---|---|---|---|
| 1-125971 | 5/1989 | Japan | 257/510 |
| 1-162373 | 6/1989 | Japan | 257/408 |
| 1-187870 | 7/1989 | Japan | 257/408 |
| 2-58378 | 2/1990 | Japan | 257/408 |
| 2-125667 | 5/1990 | Japan | 257/327 |
| 2-119184 | 5/1990 | Japan | 257/335 |
| 3-66166 | 3/1991 | Japan | 257/408 |
| 3-190278 | 8/1991 | Japan | 257/336 |

OTHER PUBLICATIONS

Vankemmel et al, '. . . Corner Effect in Trench–Like Isolated Structures', IEEE Transon ED, vol. 37 No. 1 Jan. 90, pp. 168–176.

*Primary Examiner*—Stephen D. Meier
*Attorney, Agent, or Firm*—Thomas G. Eschweiler; James C. Kesterson; Richard L. Donaldson

[57] ABSTRACT

A high voltage power transistor cell is developed that provides improved RDSon performance without sacrificing breakdown performance through utilization of trench based transistor technology. A source, drain and trench are formed within a substrate. A gate is formed on the surface over a spacing between the source and the trench. A drift region is formed around the trench. An isolation region may optionally be added allowing electrical isolation between the source and the substrate. The lateral current flow feature allows multiple high voltage power transistors, electrically isolated from one another, to exist on a single semiconductor chip. The drift region formed around the trench provides RESURF transistor characteristics without sacrificing die area.

7 Claims, 5 Drawing Sheets

5,539,238

AREA EFFICIENT HIGH VOLTAGE MOSFETS WITH VERTICAL RESURF DRIFT REGIONS

FIELD OF THE INVENTION

This invention is in the field of semiconductor integrated circuits and relates primarily to high power devices.

BACKGROUND OF THE INVENTION

In the field of power integrated circuits much work has been done in the development of power transistors. Advancements were made enabling LDMOS power transistors (lateral double diffused MOS transistor) to exhibit low "on-resistance" (RDSon) and high breakdown capability concurrently through a reduced surface field (RESURF) technique (J. A. Appels and H. M. J. Vaes, "High Voltage Thin Layer Devices (RESURF Devices)", *IEDM Tech. Digest*, pp. 238–241, 1979).

In IC design, semiconductor die area is crucial. Generally, the larger the transistor area the lower "on" resistance (hereafter referred to as RDSon) the transistor exhibits. The design trade-off of transistor performance versus device cost becomes a crucial design constraint. This issue has driven research into new transistor structures that provide low RDSon while simultaneously minimizing transistor area. One improvement has been the development of a trench DMOS transistor (Ueda, Daisuke; Takagi, Hiromitsu; Kano, Gota; "An Ultra-Low On-Resistance Power MOSFET Fabricated by Using a Fully Self-Aligned Process", *IEEE Transactions on Electron Device*, Vol. ED-34, No.4, April 1987). The power transistor illustrated in the above mentioned publication has backside drain contact and is therefore unsuitable for integrating several independent devices on a single semiconductor substrate.

It is an object of this invention to provide a power transistor utilizing trench technology for applications requiring multiple, independent devices integrated onto a single semiconductor die. It is another object of this invention to provide a high voltage power transistor utilizing trench technology with electrical isolation between source and substrate. Other objects and advantages of the invention will become apparent to those of ordinary skill in the art having reference to the following specification and drawings.

SUMMARY OF THE INVENTION

Trench based RESURF LDMOS (reduced surface field lateral double diffused MOS) transistor structures are developed to provide improved RDSon performance by minimizing the transistor cell pitch. A drain, source and trench are formed in a substrate. A gate is formed on the surface over a spacing between the source and the trench with the spacing forming the transistor channel. A drift region, providing RESURF transistor performance, is formed around the trench, thus reducing transistor area. The top-drain design enables multiple trench based RESURF LDMOS transistor structures to be formed on a single semiconductor die.

DESCRIPTION OF THE PREFERRED EMBODIMENT

Figure 1:
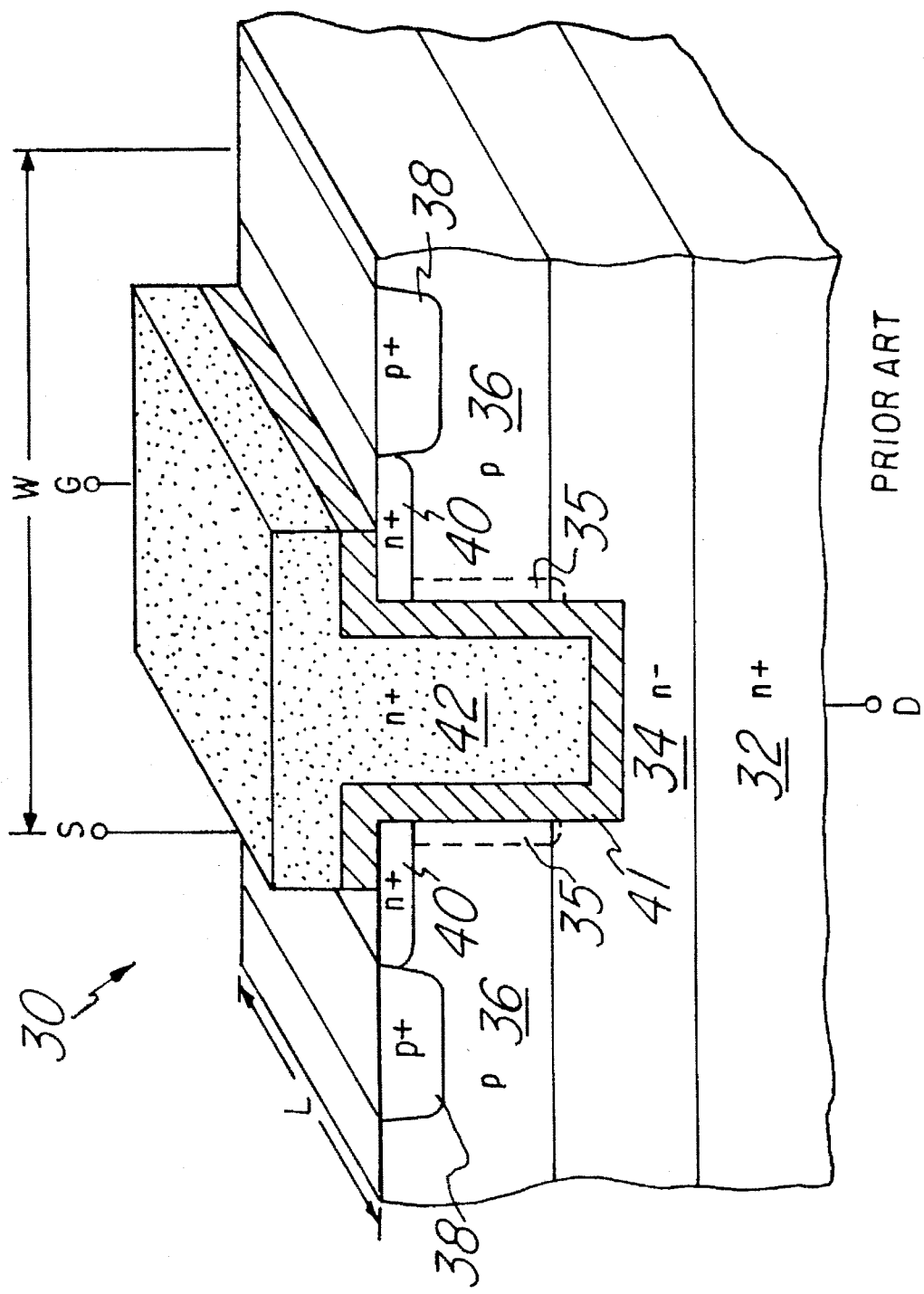
FIG. 1 is a prior art cross-section drawing illustrating a vertical trench based DMOS transistor.

FIG. 1 is a prior art cross-section illustrating a vertical trench based DMOS transistor 30. It is composed of a substrate forming a drain 32, a drift region 34, a body region 36, a backgate 38, and a source 40. A trench is formed down through body region 36 into drift region 34. The trench is lined with an oxide 41 and filled with polysilicon to form a gate 42. By providing gate trench 42, channels 35 (in body region 36) lie adjacent the trench and therefore reduce lateral spacing incurred by a channel in previous LDMOS (lateral double diffused MOS) transistors. Unfortunately, the trench based DMOS transistor 30 is a vertical device (drain region 32 is the substrate) which prohibits individually isolated multiple trench based DMOS transistors 30 from being constructed on the same die. Since vertical trench power transistors of this configuration share a common drain terminal, they cannot be individually isolated from one another.

Figure 2:
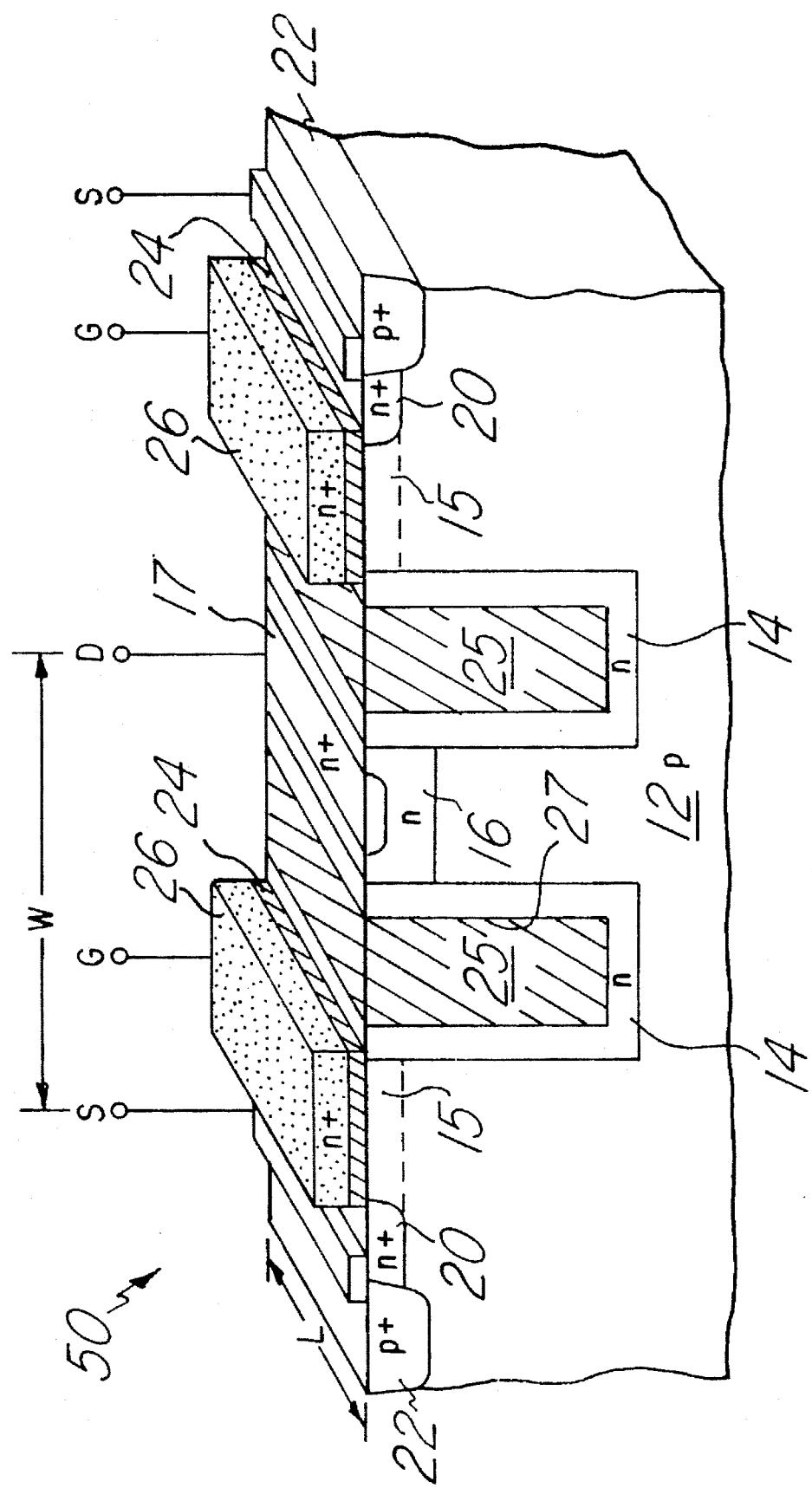
FIG. 2 is a cross-section drawing illustrating the preferred embodiment of the invention.

FIG. 2 is a cross-section drawing illustrating the preferred embodiment of the invention, a multi-cell trench based RESURF lateral DMOS (LDMOS) transistor 50. Transistor 50 includes two transistor cells 51 and 52. Each transistor cell may operate as an independent transistor. Transistor cells 51 and 52 are similarly constructed and share a common drain terminal 16 located at the top surface of semiconductor substrate 12.

Referring now to transistor cell 51, cell 51 includes a source 20, a gate 26, a trench 27, and drain 16. Source 20, gate 26 and drain 16 are formed laterally across the surface of substrate 12. Trench 27 extends into the substrate 12 and is disposed between gate 26 and drain 16. A drift region 14 wraps around trench 27. Drift region 14 surrounds a trench filled with oxide 25 and makes contact to a drain region 16 also formed in substrate 12. A source 20 and a backgate 22 are formed in substrate 12 spaced from drift region 14. A gate oxide 24 and polysilicon gate 26 are formed over a spacing 15 between source 20 and drift region 14. Spacing 15 forms a channel 15. Drain region 16 is a common drain 16 for both transistor cell 51 and transistor cell 52.

Still referring to FIG. 2, trench 27 provides transistor 50 with a long drift region 14. Drift region 14 extends from the top of trench 27 and extends underneath trench 27 and then along the other side to the top of trench 27, thus effectively providing a long drift region 14 without utilizing lateral transistor area. This advantageously provides high breakdown voltage performance without sacrificing die area. For further increased breakdown voltage performance the trench may be made deeper thereby increasing the total length of drift region 14. The increased trench depth has negligible impact on die area. Transistor 50 also differs from prior art vertical trench DMOS transistors because drain region 16 is a surface diffusion instead of the substrate thus making transistor 50 a "top drain" device. This unique feature allows multiple, individually isolated transistors 50 to be formed on the same semiconductor chip.

Still referring to FIG. 2, trench based RESURF LDMOS transistor 50 significantly reduces cell pitch (W) form prior art lateral devices. The trench feature decreases the cell pitch (W) from 8 microns in LDMOS transistors to about 3 microns for a 60 V device. A cell pitch is defined as the minimum lateral area required for a complete transistor cell. The decreased cell pitch provides an increase in cell density by a factor greater than two, thus providing more channel area for a given area of semiconductor die. Since RDSon is inversely proportional to transistor area, the decreased cell pitch provides an increase in channel area for a given area of silicon and therefore decreases transistor RDSon.

Transistor 50 may be fabricated in the following manner. A $SiO_2$ layer, approximately 1 micron thick, is formed over a P type substrate 12. A patterned resist is formed over the $SiO_2$ layer. A plurality of trenches are etched through the $SiO_2$ layer and into substrate 12 according to the patterned resist. A phosphosilicate glass (PSG) layer is formed over the surface of transistor 50. A thermal process is executed, causing an N type diffusion 14 (hereafter referred to as drift region 14) to form along the inside of the trenches. (The N type drift region 14 is created from the phosphorus in the PSG layer). The PSG layer is removed and a masked N type implant is made forming a drain 16 in the top of substrate 12. A thick $SiO_2$ layer is formed over transistor 50 such that the trenches are filled forming a trench oxide 25. The $SiO_2$ layer is etched back to the transistor 50 surface such that only trench oxide 25 inside the trenches remains. A thermal anneal process further outdiffuses both drift region 14 and drain 16. A thin $SiO_2$ is formed over transistor 50 forming a gate oxide 24. An N+ type doped polysilicon layer is formed over transistor 50. An etch removes portions of the polysilicon layer and thin $SiO_2$ layer, thus forming a gate 26. Using a resist mask an N+ type implant aligns itself to the gate 26 and forms a source 20 and a drain contact 17. Similarly, a masked P+ type implant forms backgate contact 22 thus shorting source 20 to substrate 12 (which is also circuit ground). A $SiO_2$ layer of approximately 5000 angstroms (not shown in FIG. 2) is formed over the wafer surface. Contact openings are etched into the thick oxide layer down to drain 16, source 20, and gate 26 regions. A patterned metal layer (not shown in FIG. 2) is deposited over transistor 50 making electrical contact to drain 16, source 20 and gate 26. The trench based RESURF LDMOS transistor 50 significantly reduces the cell pitch (W) from prior art.

Figure 3:
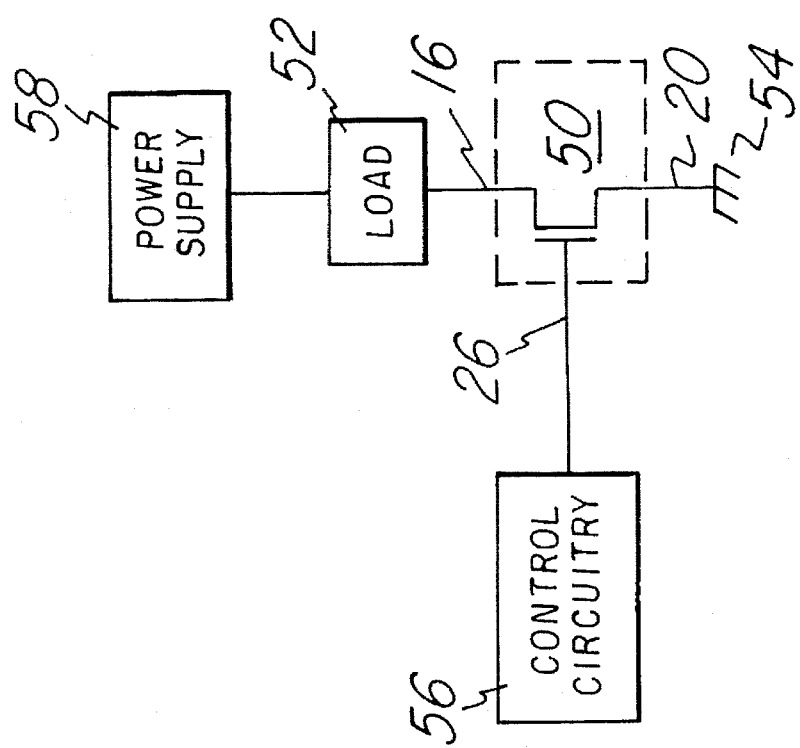
FIG. 3 is a circuit diagram illustrating a low side driver configuration.

Transistor 50 of FIG. 2, with source 20 electrically coupled to substrate 12 through backgate contact 22 (and therefore tied to ground), is duly suited for operation in low side driver configurations. A low side driver configuration, seen in FIG. 3 consists of transistor 50 with drain 16 connected to a load 52, source 20 connected to circuit ground 54, and gate 26 connected to control circuitry 56.

Referring to FIG. 2, transistor 50 operates in the following manner. When a voltage greater than the transistor 50 threshold voltage ($V_t$) appears on gate 26, channel 15 inverts and current flows from drain contact 17, through drain 16, through drift region 14, through channel 15, and finally through source 20. Drift region 14 operates to reshape the electric field such that it is reduced at the gate oxide 24-drift region 14 interface, thus increasing the breakdown voltage rating and decreasing the RDSon of the device. Through proper design of drift region 14 length, doping, and thickness both transistor RDSon and breakdown may be optimized. Since the length of drift region 14 is directly proportional to the breakdown voltage rating it can be seen that transistor 50 provides high breakdown voltage ratings by extending the depth of the trench without increasing the cell pitch (W); thus transistor 50 area does not increase.

During breakdown conditions, when drain 16 reaches a voltage greater than the maximum rating for normal operation, the following occurs: as drain 16 increases in voltage, depletion regions grow along the drift region 14-substrate region 12 boundary with the depletion region being larger near drain 16 since the voltage is greatest at drain 16. Simultaneously, a depletion region forms at the drain 16-substrate 12 interface. When drift region 14 becomes fully depleted transistor 50 breaks down with the breakdown path located near the drain 16-substrate 12 boundary. This prevents breakdown from occurring near thin gate oxide 24 lying over channel 15.

Figure 4:
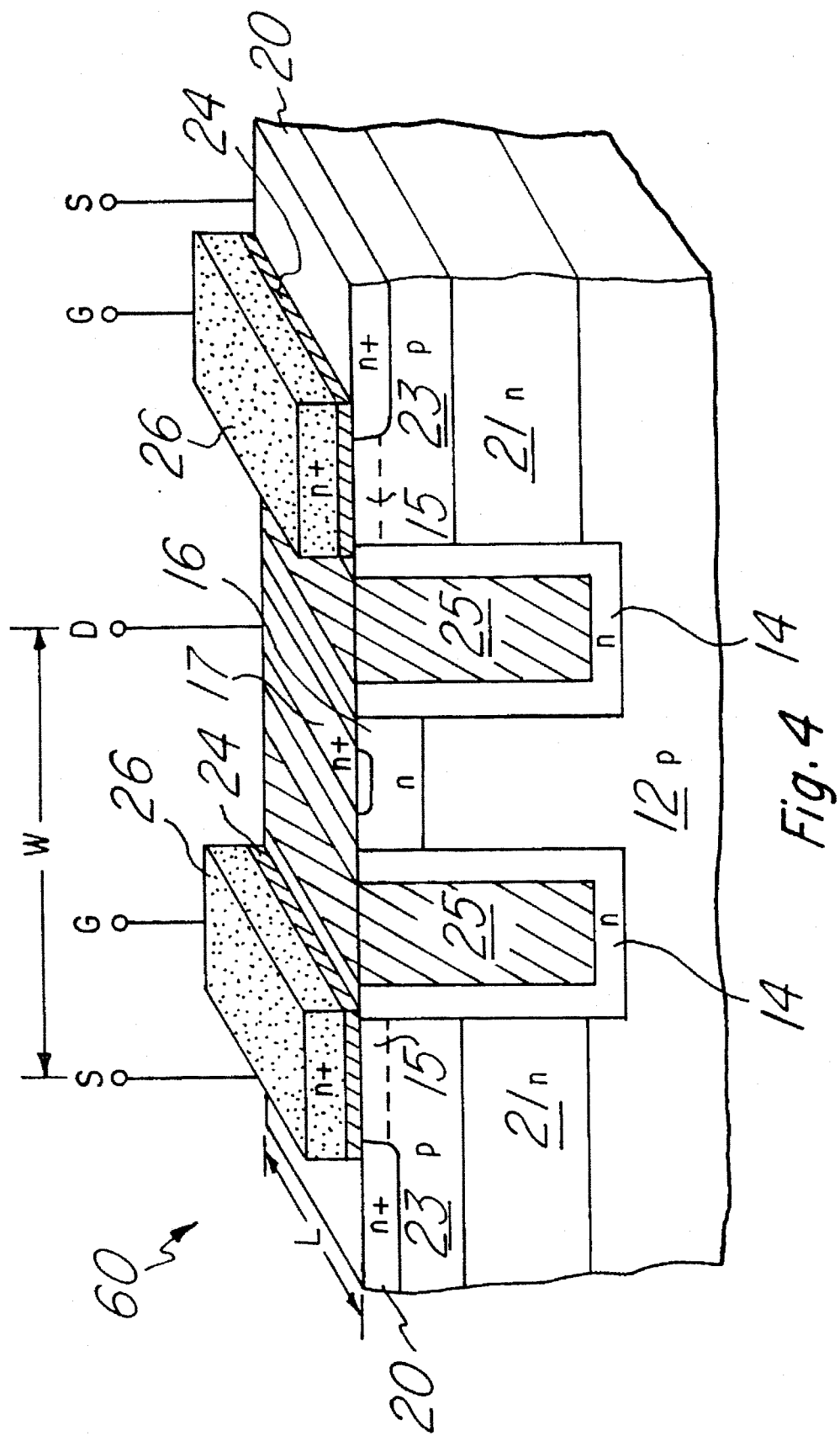
FIG. 4 is a cross-section drawing illustrating an alternative embodiment of the invention.

FIG. 4 is an alternative embodiment of the invention. Structurally, isolation region 21 differentiates transistor 60 from transistor 50 in FIG. 2. Isolation region 21 electrically isolates source 20 from substrate 12. In this example, isolation region 21 comprises an N type doped region. Trench based RESURF LDMOS transistor 60 is fabricated in a similar manner as transistor 50 in FIG. 2 except that large N type isolation regions 21 are formed before the formation of the first $SiO_2$ layer. Masked P type regions 23 (hereafter referred to as body regions 23) are formed within isolation regions 21. When trenches are etched into the wafer the trenches are centered over the isolation region 21-body region 23 boundary edges. The remainder of transistor 60 fabrication follows the process described for FIG. 2.

Figure 5:
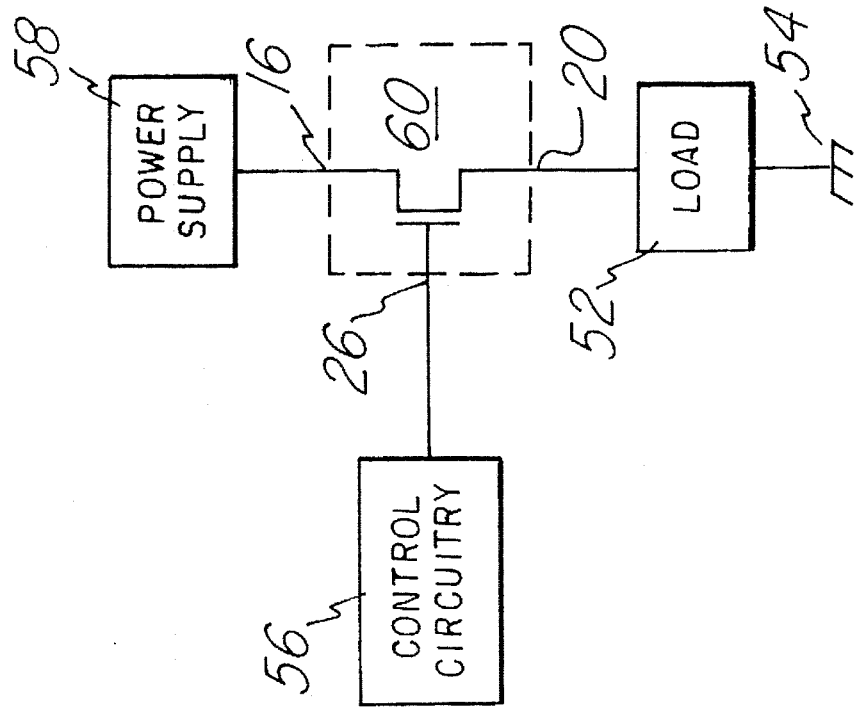
FIG. 5 is a circuit diagram illustrating a high side driver configuration.

Transistor 60 of FIG. 4 is unique due to the electrical isolation of source 20 from substrate 12 created by the existence of isolation regions 21. This allows transistor 60 to be utilized in applications such as high side drivers requiring electrical isolation between source 20 and substrate 12, thus increasing the scope of transistor's 60 applicability. A high side driver, shown in FIG. 5, consists of a transistor 60 with drain 16 connected to a power supply 58, source 20 connected to a load 52, and gate 26 connected to control circuitry 56.

Figure 6:
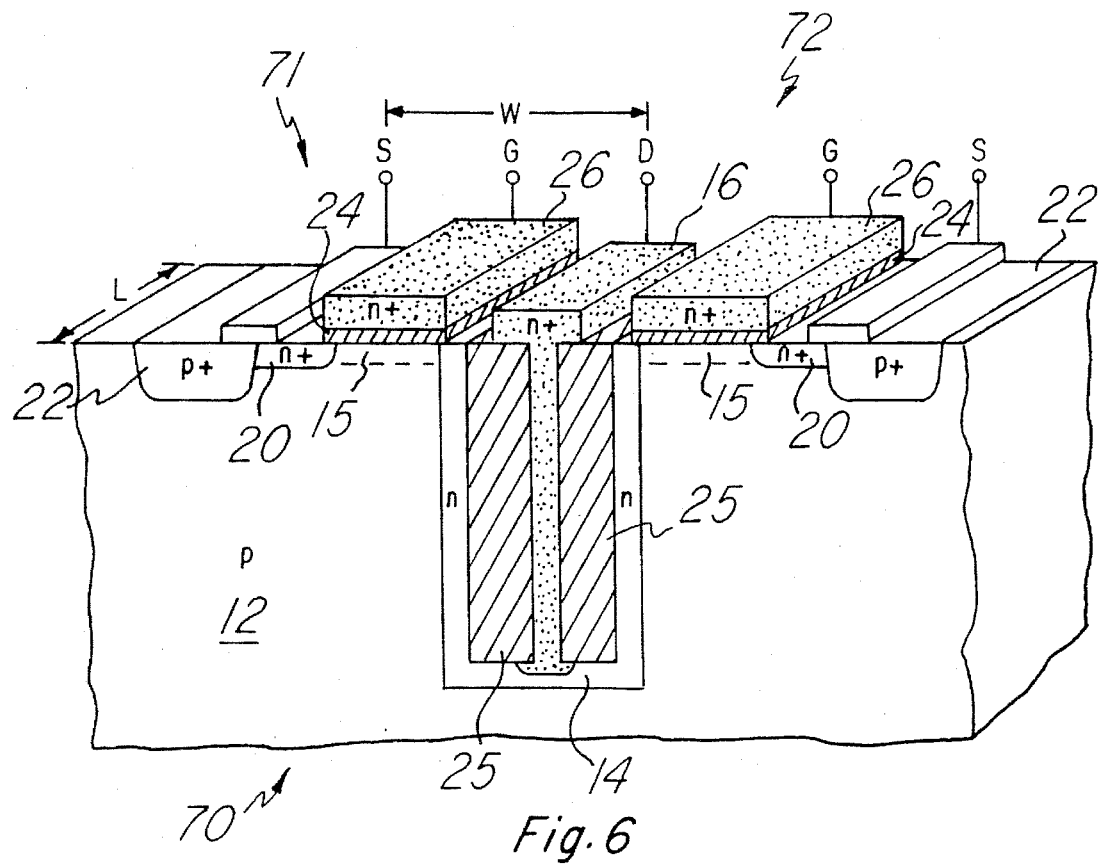
FIG. 6 is a cross-section drawing illustrating another alternative embodiment of the invention.

FIG. 6 illustrates another alternative embodiment of the invention. Trench based RESURF LDMOS transistor 70 differs from transistor 50 in that drain 16 is formed within trench 27 and is composed of polysilicon. Drain 16 extends through oxide 25 within trench 27 and makes contact to the portion of drift region 14 underlying trench 27. This allows a designer to eliminate the lateral area between the trenches previously occupied by drain 16. This configuration also allows two transistor cells 71 and 72 to share a single trench 27. Therefore only one trench 27 is needed for every two transistor cells. This further reduces cell pitch and since a reduction in cell pitch (W) corresponds to a reduction in RDSon, RDSon is further reduced.

To form transistor 60 of FIG. 6, trenches are created as in the process described in FIG. 2. After a thick $SiO_2$ layer 25 fills the trenches and is etched back on the surface of the wafer such that the $SiO_2$ layer 25 only fills the trenches forming a trench oxide 25, a selective anisotropic etch is used to etch a trench within the multiple trench oxides 25. The anisotropic etch enables only horizontal surfaces to be etched, therefore the side walls of trench oxide 25 are not etched and the etch works in only the vertical direction. A thin $SiO_2$ layer is formed over the face of the wafer (and also on the lateral surface along the bottom of the trenches). A patterned wet etch removes portions of the $SiO_2$ layer including the lateral surfaces inside the trenches, thus forming a gate oxide 24. An N+ type doped polysilicon layer is formed over the surface of the wafer and fills in the trenches. An etch then patterns the polysilicon layer forming both drain 16 and gate 26. Remaining process steps follow the process flow described for FIG. 2.

In FIG. 6, since the length of drift region 14 is directly proportional to transistor 70 breakdown voltage, trenches must be made deeper to provide the same breakdown voltage rating provided by transistor 50. Transistor 70 is ideal for low side driver applications since source 20 is coupled to substrate 12 via backgate 22.

Figure 7:
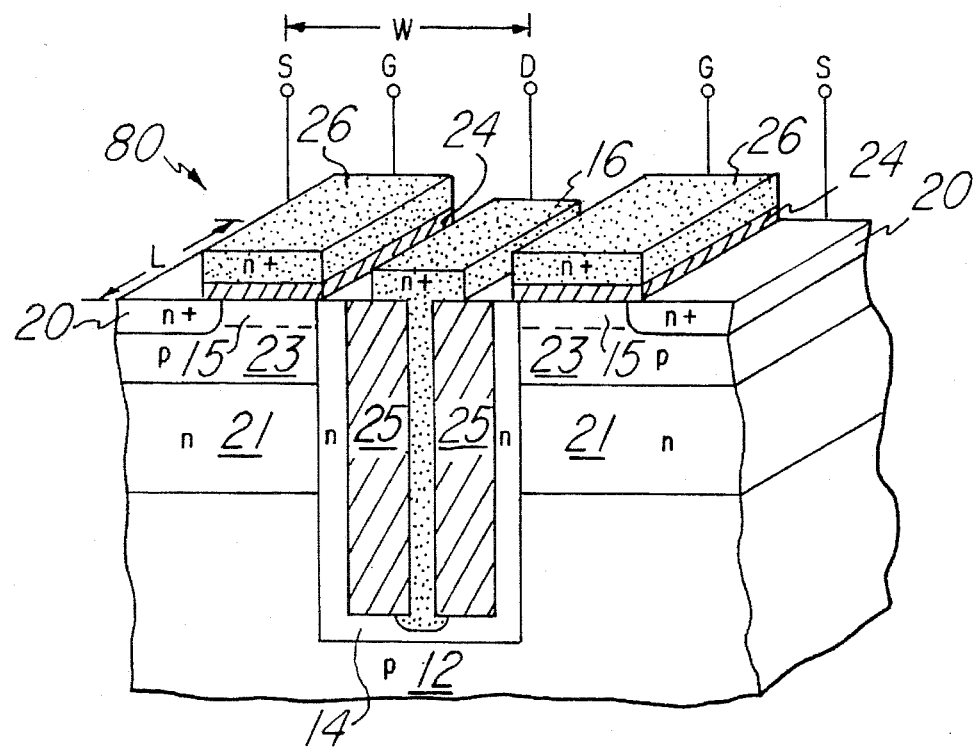
FIG. 7 is a cross-section drawing illustrating another alternative embodiment of the invention.

FIG. 7 is yet another alternative embodiment of the invention. Transistor 80 is a trench based RESURF LDMOS transistor 80 with drain 16 formed within trench oxide 25 as in FIG. 6. However, an isolation region 21, as in FIG. 4, electrically isolates source 20 from substrate 12. Transistor 80, therefore, has a greater scope of applications such as high side driver configurations that require electrical isolation between source 20 and ground potential (substrate 12). This structural difference requires an additional process step. Before a $SiO_2$ layer is formed over the surface of the wafer a resist mask is used to form a large N type isolation region 21. Using the same resist mask a P type tank 23 (hereafter referred to as body region 23) is formed within isolation region 21. Remaining process steps follow the process flow described for FIG. 6.

Although the invention has been described with reference to a preferred embodiment herein, this description is not to be construed in a limiting sense. Various modifications of the disclosed embodiment will become apparent to persons skilled in the art upon reference to the description of the invention. It is therefore contemplated that the appended claims will cover any such modifications or embodiments as fall within the true scope of the invention.

What is claimed is:

1. A lateral power transistor, comprising:

source;

gate;

drain;

trench disposed between the gate and the drain; and drift region surrounding the trench.

2. The lateral power transistor of claim 1 further comprising an insulator filling the trench.

3. The lateral power transistor claim 2 wherein the insulator is oxide.

4. The lateral power transistor of claim 1 wherein the source and drain are composed of N type semiconductor material and the gate is composed of polycrystalline silicon.

5. A power transistor, comprising:

a substrate;

a body region formed in the substrate;

a source region formed in the body;

a gate;

a drain region formed in the substrate;

a trench formed in the face of the substrate between the source region and the drain region; and a drift region encircling the trench.

6. The power transistor of claim 5 further comprising an isolation region formed in the face of the substrate below the body region to electrically isolate the source region from the substrate.

7. The high voltage power transistor cell of claim 5 wherein the substrate doping concentration and the drift region depth and doping profile are designed according to RESURF transistor design principles such that the drift region fully depletes at or before rated breakdown voltage of the high voltage power transistor.

\* \* \* \* \*